(12) United States Patent
Sandon et al.

(10) Patent No.: US 7,865,749 B2
(45) Date of Patent: Jan. 4, 2011

(54) METHOD AND APPARATUS FOR DYNAMIC SYSTEM-LEVEL FREQUENCY SCALING

(75) Inventors: Peter A. Sandon, Essex Junction, VT (US); Cedric Lichtenau, Boeblingen (DE); Martin Recktenwald, Steinenbronn (DE); Thomas Pflueger, Leinfelden (DE); Rolf Hilgendorf, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 1028 days.

(21) Appl. No.: 10/595,520

(22) PCT Filed: Oct. 31, 2003

(86) PCT No.: PCT/US03/34702

§ 371 (c)(1),
(2), (4) Date: Jan. 12, 2007

(87) PCT Pub. No.: WO2005/052820

PCT Pub. Date: Jun. 9, 2005

(65) Prior Publication Data

US 2007/0208964 A1    Sep. 6, 2007

(51) Int. Cl.
*G06F 1/32* (2006.01)
(52) U.S. Cl. .................. 713/322; 713/300; 713/600
(58) Field of Classification Search .......... 713/300, 713/320, 322, 323, 375, 600
See application file for complete search history.

(56) References Cited

U.S. PATENT DOCUMENTS

| | | |
|---|---|---|
| 3,864,556 A | 2/1975 | Fluet |
| 5,047,733 A | 9/1991 | Nonaka et al. |
| 6,466,073 B1 | 10/2002 | Yukinari et al. |
| 6,728,890 B1 * | 4/2004 | Mirov et al. ............... 713/300 |
| 6,845,462 B2 * | 1/2005 | Yatsuda et al. ............ 713/501 |
| 7,290,161 B2 * | 10/2007 | Kahn ........................ 713/500 |
| 2004/0098631 A1 * | 5/2004 | Terrell, II ................ 713/322 |
| 2005/0022038 A1 * | 1/2005 | Kaushik et al. ........... 713/300 |

OTHER PUBLICATIONS

Kozierok, Derived System Clocks, The PC Guide, Apr. 17, 2001, Version 2.2.0, pp. 1-2.

* cited by examiner

*Primary Examiner*—Mark Connolly
*Assistant Examiner*—Paul B Yanchus, III
(74) *Attorney, Agent, or Firm*—H. Daniel Schnurmann

(57) ABSTRACT

A method and apparatus for changing a clock frequency in a system (10) comprising a plurality of synchronous integrated circuit chips (12, 14, 16), and a circuit (20) for implementing the frequency change. The method includes: detecting a change in processing requirements in one of the plurality of synchronous integrated circuit chips; notifying the plurality of synchronous integrated circuit chips that a clock frequency change is to occur; achieving a quiescent bus state in each of the plurality of synchronous integrated circuit chips; notifying the plurality of synchronous integrated circuit chips that the clock frequency change can occur; and changing the clock frequency of the plurality of integrated circuit chips.

18 Claims, 3 Drawing Sheets

METHOD AND APPARATUS FOR DYNAMIC SYSTEM-LEVEL FREQUENCY SCALING

BACKGROUND ART

The present invention relates in general to integrated circuits. More particularly, the present invention is directed to a power management method and apparatus for changing the clock frequency in multiple, synchronous integrated circuit chips within a system.

One way of reducing energy consumption or power dissipation in an integrated circuit, such as a microprocessor, is to slow down the frequency at which circuits are switched, when performance requirements are low. There are a number of processor designs that support such frequency scaling within a single chip. Examples include the PowerPC 750FX, available from International Business Machines, Inc., and the Pentium 3, available from Intel Corp.

Several techniques are commonly used to reduce processor frequency for power management within a processor. For example, in a first technique, a processor reduces its internal clock speed independently of the rest of the system, while the bus speed is maintained at a constant rate. This is only practical if the bus frequency is a relatively low fraction of the maximum processor frequency, since there is a lower limit on the ratio of processor to bus frequency. In a second technique, a reset sequence is performed in which the processor is turned off, reconfigured along with the bus for operation at a lower frequency, and turned back on. Unfortunately, the cost of switching frequency is relatively high in this case, in terms of the latency of the transition, and so this approach does not support a fine-grained frequency adjustment scheme for managing power.

There is a need, therefore, for a method and apparatus for changing the clock frequency in multiple, synchronous integrated circuit chips within a system, while maintaining a fixed ratio of processor to bus frequency, in a seamless manner while the system continues to operate. There is also a need for a method and apparatus for changing the clock frequency in multiple, synchronous integrated circuit chips within a system, which is capable of supporting a fine-grained frequency adjustment scheme for managing power.

SUMMARY OF THE INVENTION

The present invention provides a low latency power management method and apparatus for changing the clock frequency in multiple, synchronous integrated circuit chips within a system. The frequency change is performed in a seamless manner, while the system continues to operate. The method and apparatus of the present invention is applicable, for example, to systems in which a change to the processor frequency is accompanied by a change to the bus frequency. This would be the case, for example, in a high performance system in which, at the highest frequency configuration, the processor frequency is a minimum multiple of the bus frequency (i.e., the processor frequency cannot be reduced to save power, without reducing the bus frequency as well).

A first aspect of the present invention is directed to a method for changing a clock frequency in a system comprising a plurality of synchronous integrated circuit chips, comprising: detecting a change in processing requirements in one of the plurality of synchronous integrated circuit chips; notifying the plurality of synchronous integrated circuit chips that a clock frequency change is to occur; achieving a quiescent bus state in each of the plurality of synchronous integrated circuit chips; notifying the plurality of synchronous integrated circuit chips that the clock frequency change may occur; and changing the clock frequency of the plurality of integrated circuit chips.

A second aspect of the present invention is directed to an apparatus for changing a clock frequency, comprising: a phase-lock-loop circuit for providing a constant frequency signal in synchronism with a reference clock signal, wherein the constant frequency signal has a frequency f; a plurality of divider circuits receiving the constant frequency output signal from the phase-lock-loop circuit, each divider circuit providing an output signal having a frequency given by $f/d_n$ and synchronous with the constant frequency signal of the phase-lock-loop circuit, wherein $d_n$ is a divider value of an nth divider circuit; and a multiplexer for receiving the output signals from the plurality of divider circuits and for selecting, based on a frequency selection signal, the output signal from one of the plurality of divider circuits, having a desired frequency, to serve as a processor clock signal (pclk).

A third aspect of the present invention is directed to a method for changing processor and bus clock frequencies in a system comprising a plurality of synchronous processors, comprising: detecting a change in processing requirements in one of the plurality of processors; notifying the plurality of processors that processor and bus clock frequency changes are to occur; achieving a quiescent bus state in each of the plurality of processors; notifying the plurality of processors that the processor and bus clock frequency changes may occur; and changing the processor and bus clock frequencies of each of the plurality of processors.

The exemplary aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings in which.

Figure 1:
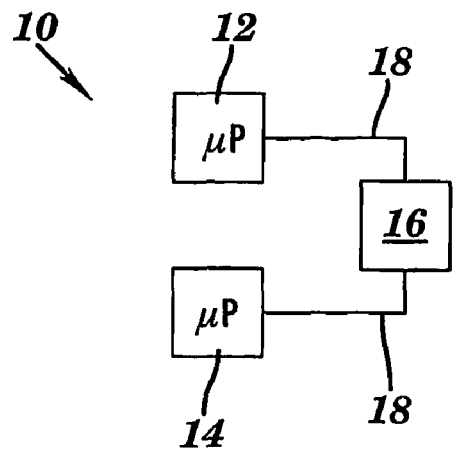
FIG. 1 illustrates an exemplary prior art multiprocessor system including two processors connected to a companion chip by a bus.

It should be noted that the drawings are merely schematic representations, not intended to portray specific parameters of the invention. The drawings are intended to depict only typical aspects of the invention, and therefore should not be considered as limiting the scope of the invention. In the drawings, like numbering represents like elements.

DETAILED DESCRIPTION OF THE INVENTION

The present invention addresses the above-mentioned problems, as well as others, by providing a low latency power management method and apparatus for changing the clock frequency in multiple, synchronous integrated circuit chips within a system, in a seamless manner, while the system continues to operate. The method and apparatus of the present invention is applicable, for example, to systems in which a change to the processor frequency is accompanied by a change to the bus frequency. This would be the case, for instance, in a high performance system in which, at the highest frequency configuration, the processor frequency is a minimum multiple of the bus frequency. In such a high performance system, the available processor to bus frequency ratios might be 2:1, 3:1, 4:1 and 6:1. If the maximum processor frequency is 2 GHz and the maximum bus frequency is 1 GHz, then the highest performance configuration will use those frequencies. To reduce the processor frequency without reducing the bus frequency when the system is in the highest performance configuration, would reduce the ratio below 2:1, which is not supported. Therefore, both the processor and bus frequency must be reduced together to achieve power savings.

The present invention is described below in terms of processors and a companion chip that generate both core clocks and bus clocks from a single input reference clock. In addition, an input synchronizing pulse, which occurs at a fixed period with respect to the reference clock, is used to provide a synchronizing signal for the processors and companion chip. Further, it is assumed that the processors and companion chip are part of a multiprocessor system, in which two or more processors are connected to the companion chip, and that all of these components must switch clock frequency together. It should be clear to one of ordinary skill in the art, however, that the method and apparatus of the present application could be applied to systems other than those described below, without departing from the scope of the invention as set forth in the claims.

Referring now to FIG. 1, there is illustrated an exemplary prior art multiprocessor system 10 including at least two processors 12, 14, each connected to a companion chip 16 by a bus 18. In this example, it is assumed that each processor 12, 14, as well as companion chip 16, generate core clocks and bus clocks from a single input reference clock. In addition, an input synchronizing pulse, which occurs at a fixed period with respect to the reference clock, is used to provide a synchronizing signal for the processors and companion chip.

The processors 12, 14 may each comprise any now known or later developed type of processor. The companion chip 16 may comprise, for example, a bridge from the processors 12, 14 to memory, high-speed I/O, or other component(s) (not shown) of the multiprocessor system 10. An example of such a bridge is the Northbridge available from Intel. As known in the art, the Northbridge communicates via the frontside bus with a processor and controls interaction, for example, with memory, the peripheral component interconnect (PCI) bus, and the accelerated graphics port (AGP). The Northbridge is one part of a two-part chipset called Northbridge/Southbridge. The Southbridge handles the input/output functions of the chipset.

Figure 2:
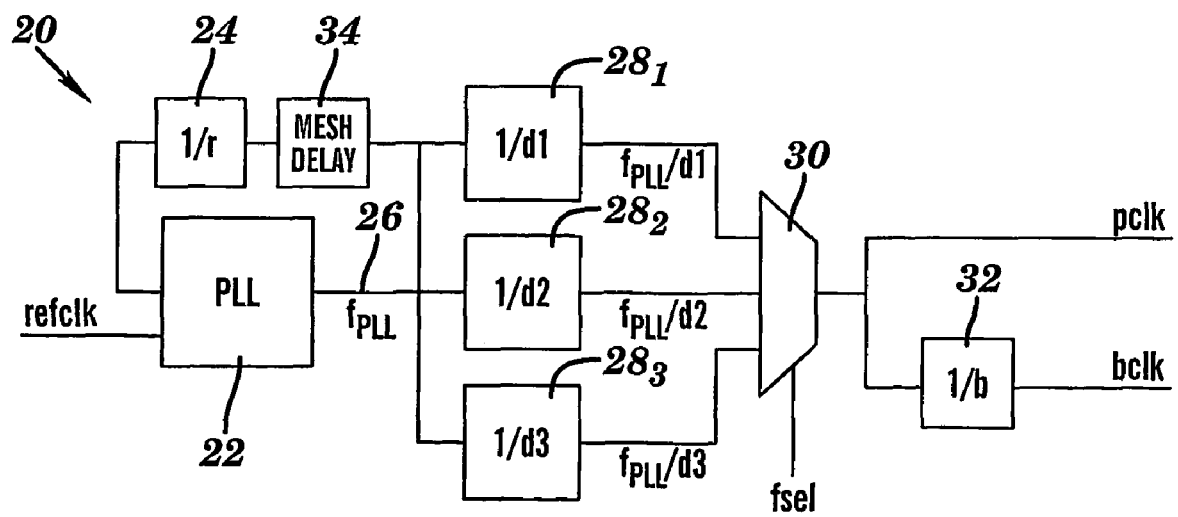
FIG. 2 illustrates a phase-lock-loop (PLL) circuit for seamlessly changing the clock frequency of a processor and bus in accordance with the present invention.

A phase-lock-loop (PLL) circuit 20 for seamlessly changing the processor clock (pclk) and bus clock (bclk) frequencies of a processor, while maintaining the ratio between these two clocks at a fixed value, in accordance with the present invention, is shown in FIG. 2. The PLL circuit 20 is internal to the processor(s) in the system (e.g., processors 12, 14, FIG. 1). The PLL circuit 20 includes a PLL 22 for synchronizing the processor clock (pclk) to a reference clock (refclk), and a feedback path including a feedback divider 24 (with divider value r) and a mesh delay 34. The mesh delay 34 is used to simulate propagation delay through the clock distribution network. The PLL 22 and feedback divider 24 operate in a conventional manner, with the mesh delay 34 replacing the usual direct feedback from the clock distribution network, to generate a signal 26 at the output of the PLL 22 having a predetermined, constant frequency $f_{PLL}$.

The output signal 26 of the PLL 22 is supplied to a plurality of clock dividers 28 (three in this embodiment), each having a different divider value d, wherein d is an integer greater or equal to 1. The divider values d may be fixed or selectable by the processor, depending on the requirements/design of the system. The plurality of clock dividers 28 produce different clock frequencies that are all synchronous to the PLL 22 and the reference clock (refclk). Although three clock dividers 28 are shown and described, it should be noted that two or more clock dividers 28 can be used in the practice of the present invention.

As shown in FIG. 2, the output frequency of the clock divider $28_1$ is given by $f_{PLL}/d_1$, while the output frequencies of clock dividers $28_2$, $28_3$, are $f_{PLL}/d_2$ and $f_{PLL}/d_3$, respectively. For example, if $f_{PLL}$=2 Ghz, and the divider values $d_1$, $d_2$, and $d_3$ are equal to 1, 2, and 4, respectively, then the output frequencies of the clock dividers $28_1$, $28_2$, and $28_3$, are 2 Ghz, 1 Ghz, and 0.5 Ghz, respectively.

The outputs of the clock dividers $28_1$, $28_2$, and $28_3$ are fed into a multiplexer 30. The multiplexer 30 chooses one of these clock signals to be the processor clock (pclk), based on a frequency selection signal (fsel). The processor clock (pclk) is then further divided by a frequency divider 32, having a divider value b, to produce the bus clock (bclk), which is synchronous with the processor clock (pclk). The divider value b may be fixed or selectable by the processor, depending on the requirements/design of the system. The divider value b is an integer greater or equal to 2 in this embodiment. However, it should be noted that in other embodiments, the divider value b might be less than 2 or may have a non-integral value, such as 3/2. It should also be noted that there is a lowest allowed value of the divider value b, and if the high performance configuration uses that lowest value, there is no way to reduce processor frequency without reducing bus frequency.

In accordance with the present invention, an initiating processor 12, 14 (e.g., a processor that detects a change in idle time) sends a control transaction, along with configuration data, to a companion chip 16, which broadcasts the control transaction and configuration data to the other processors in the system. In order to change the bus frequency, the other bus agents (e.g., processors) must be aware of the change, and perform a similar bus frequency change. The present invention employs the bus 18 and its snooping functionality to broadcast the control transaction and configuration data, along with other communication signals, over the sidebands of the bus, to provide a synchronizing function. The processor and bus frequency change procedure is described below with regard to FIGS. 3 and 4.

Figure 3:
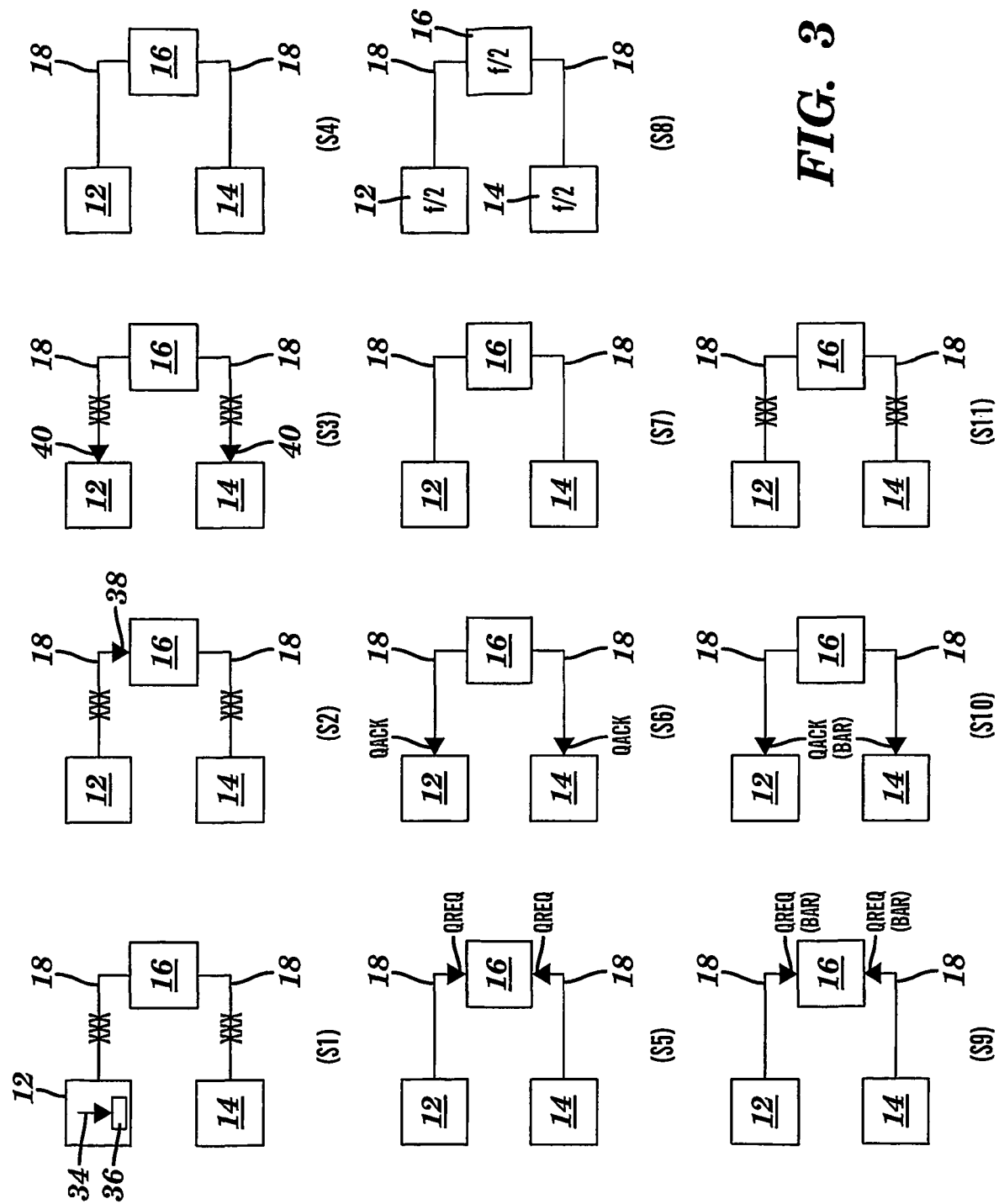
FIG. 3 illustrates a processor and bus frequency change procedure of the present invention applied to the multiprocessor system shown in FIG. 1.
Figure 4:
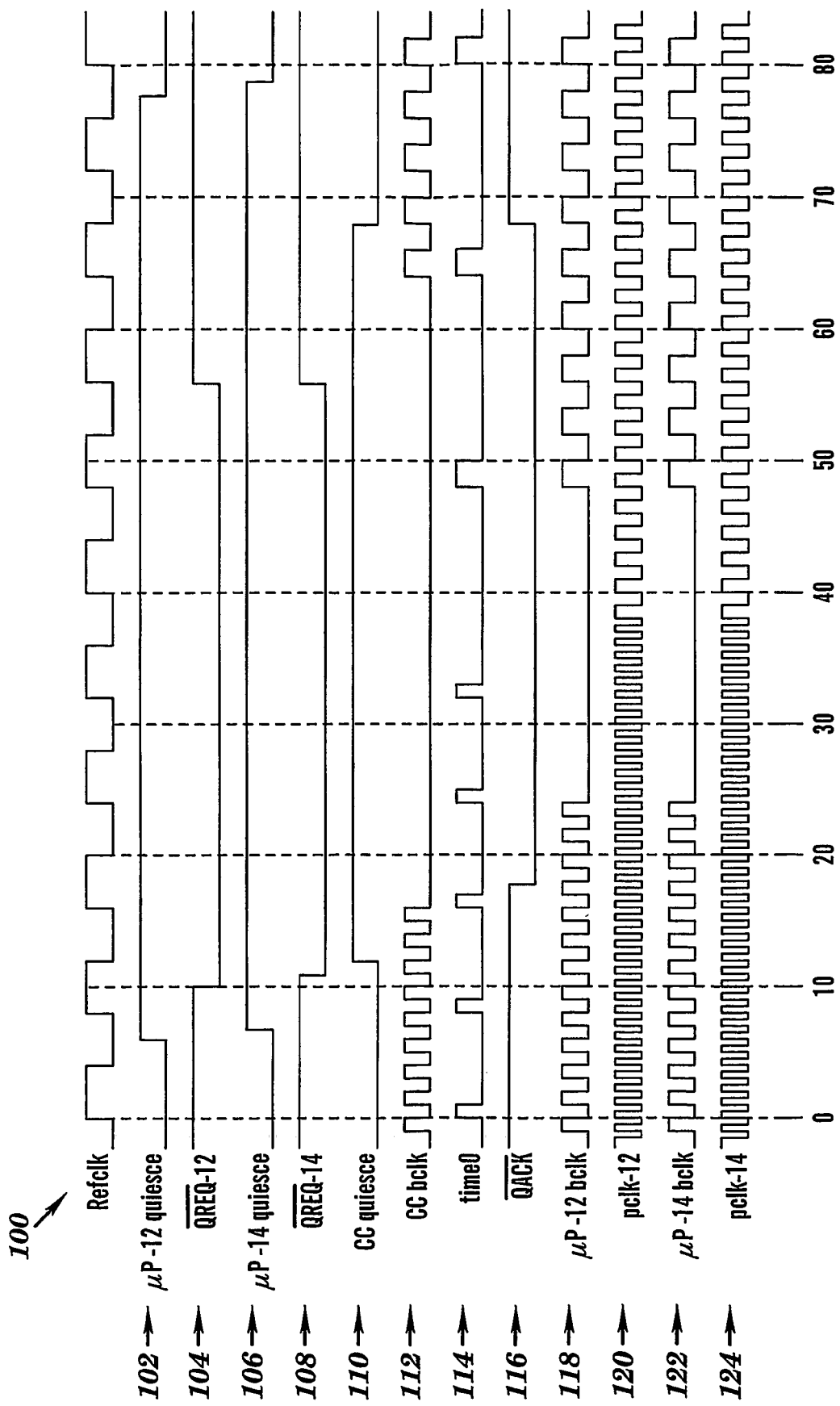
FIG. 4 is a timing diagram illustrating the timing sequence of a processor and bus frequency change procedure in accordance with the present invention.

FIG. 3 illustrates a processor and bus frequency change procedure in the multiprocessor system 10 of FIG. 1, wherein the frequencies of the processor clock (pclk) and the bus clock (bclk) are each reduced to half speed. An exemplary timing diagram 100 illustrating the frequency change procedure is illustrated in FIG. 4. It should be noted that the timing diagram 100 of FIG. 4 is merely intended to show the relative ordering of events in the frequency change procedure of the present invention, and not the actual latencies between those events.

Initially, an operating system, running on one of the processors 12, 14 (12 in FIG. 3), detects a change in idle time, or predicts a change (e.g., a reduction) in processing requirements, which initiates a frequency change procedure. The processor 12 commences a frequency change via software by writing (step S1) a configuration value 34, corresponding to the target frequency being switched to, to a power control register 36 in the processor 12. The write to the power control register 36 initiates a bus transaction that transfers 38 (step S2) the configuration data to the companion chip 16 via the bus 18. This alerts the companion chip 16 that a frequency change has been initiated by the processor 12. Alternatively, the configuration data may be transferred to the companion chip 16 via pins on the processor 12 and companion chip 16. Once the companion chip 16 has been informed of the impending frequency change, it ensures (step S3) that all of the processors 12, 14 in the multiprocessor system 10 become aware of the frequency change by broadcasting 40 the control transaction and configuration data on the bus 18. Each processor 12, 14 snoops this bus 18 transaction, captures the configuration data, and starts its frequency change procedure (e.g., via a frequency change state machine). The companion chip 16 also begins its internal frequency change procedure at this time. Prior to broadcasting 40 the control transaction and configuration data on the bus 18, however, the companion chip 16 checks if any other frequency change process is currently active and, if so, the pending frequency change process is ignored. Otherwise, the pending frequency change process proceeds normally. It should be noted that the companion chip 16 may also initiate a frequency change in the practice of the present invention.

Each component in the multiprocessor system 10 (e.g., processors 12, 14 and companion chip 16) then initiates the process of achieving a quiescent bus state (step S4), which is sufficient to allow the frequency change. This quiescent state corresponds to completing currently active transactions on the bus 18 to the point where no timing constraints exist on the bus 18 between what has been sent, and what will be sent next. When each processor 12, 14 has its bus 18 in a quiescent state (sending Null transactions, acknowledging received transactions, accepting incoming data), it asserts QREQ (step S5) on a sideband of the bus 18. The timing of this process is shown in the timing diagram 100 of FIG. 4. In particular, with regard to processor 12, a 0-12 quiescent signal 102, indicating that processor 12 has reached a quiescent bus state, is asserted at cycle 6, and a QREQ-12 signal 104 is asserted by processor 12 at cycle 10. Similarly, with regard to processor 14, a μP-14 quiescent signal 106, indicating that processor 14 has reached a quiescent bus state, is asserted at cycle 7, and a QREQ-14 signal 108 is asserted by processor 14 at cycle 11.

When the companion chip 16 has its bus 18 in a quiescent bus state (sending Null transactions, acknowledging received transactions), and all QREQs from all of the processors 12, 14 have been asserted, the companion chip 16 no longer has to accept or respond to incoming transactions. The companion chip 16 then stops its bus clock on a cycle related to an internal synchronizing pulse (time0) and asserts a sideband signal QACK on the bus 18 to all of the processors 12, 14, (step S6) indicating that the processors 12, 14 can now turn off their bus clocks. The internal synchronizing pulse (time0) is present in the processors 12, 14 and the companion chip 16, and is derived from an external synchronizing signal. As shown in FIG. 4, a CC quiescent signal 110, indicating that the companion chip 16 has reached a quiescent bus state, is asserted at cycle 12, the companion chip 16 bus clock (CC bclk) 112 is stopped at cycle 16 in synchronism with a time0 signal 114, and a QACK signal 116 is asserted by the companion chip 16 at cycle 18.

In response to the QACK signal 116, the processors 12, 14 stop responding to incoming transactions and stop their bus clocks (step S7). As shown in FIG. 4, a bus clock (μP-12 bclk) 118 of processor 12 and a bus clock (μP-14 bclk) 122 of processor 14 are stopped at cycle 24 in synchronism with the time0 signal 114. After stopping its bus clock, each processor 12, 14 executes the required frequency change (step S8) by changing (i.e., selecting via fsel and multiplexer 30, FIG. 2) which clock divider $28_1$, $28_2$, and $28_3$ drives the processor clock and the bus clock, based on the frequency value set forth in the configuration data. In this example, a clock divider 28 having a divider value of 2 (i.e., 50% reduction in frequency) is selected by the multiplexer 30. At this time, the configuration data associated with the new frequency is installed in the processors 12, 14. As shown in FIG. 4, the frequency of the processor clock (pclk-12) 120 of processor 12 is reduced in half at cycle 38. Similarly, the frequency of the processor clock (pclk-14) 124 of processor 14 is reduced in half at cycle 38, in synchronism with the frequency change of the processor clock (pclk-12) 120 of processor 12. Although shown as occurring in synchronism, it should be noted that the frequency reduction of the processor clock (pclk-14) 124 of processor 14 can also occur asynchronously with respect to the frequency change of the processor clock (pclk-12) 120 of processor 12. At the beginning of the next synchronizing pulse (e.g., the time0 signal 114), each processor 12, 14 restarts its bus clock. In particular, as shown in FIG. 4, the bus clock (μP-12 bclk) 118 associated with processor 12, and the bus clock (μP-14 bclk) 122 associated with processor 14, are restarted in synchronism with the time0 signal 114 at cycle 48.

After each processor 12, 14 has restarted its respective bus clock, it negates (step S9) its bus 18 sideband signal QREQ-12 104, QREQ-14 108, respectively, at cycle 56, indicating that it is now ready to accept incoming transactions. Again, although shown as occurring in synchronism, it should be noted that the processors 12, 14 may negate their sideband signals QREQ-12 104, QREQ-14 108 at different times. When the companion chip 16 determines that all bus 18 sideband signals QREQ-12 104, QREQ-14 108 have been negated, and it has finished its own frequency change sequence, its starts its own bus clock (CC bclk) 112 at cycle 64, again in synchronism with the time0 signal 114. The companion chip 16 then negates the bus 18 sideband signal QACK 116 at cycle 68, indicating (step S10) to the processors 12, 14 that they can commence (step S11) outgoing bus activity.

It should be noted that during the time the processor 12 is signaling (steps S1-S2, FIG. 3) a frequency change to the companion chip 16, and until the companion chip 16 broadcasts (step S3) the configuration data back to the processor 12, the processor 12 can operate normally. The processor 14 and companion chip 16 also operate normally during this time period. Once the processor 12 begins to quiescent (step S4) its bus 18, it will no longer be able to access data and instructions from the bus 18. However, as long as the processor 12 is able to execute with data and instructions in its associated internal caches, it can continue to operate.

Referring to FIG. 3, the method of the present invention can be summarized as follows:

Step S1: Initiating processor 12 writes to power control register 36.

Step S2: Control transaction is sent to companion chip 16.

Step S3: Control transaction is broadcast via bus to all processors 12, 14.

Step S4: All devices (processors 12, 14 and companion chip 16) quiesce their busses 18.

Step S5: Processors 12, 14 signal to companion chip 16 that they are quiescent.

Step S6: Companion chip 16 stops bus clocks and signals to processors 12, 14.

Step S7: Processors 12, 14 stop bus clocks.

Step S8: Processors 12, 14 and companion chip 16 change processor/bus clock frequencies.

Step S9: Processors 12, 14 start bus clocks and signal companion chip 16.

Step S10: Companion chip 16 starts bus clock and signals processors 12, 14.

Step S11: Normal activity proceeds.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

The invention claimed is:

1. A method for changing a clock frequency in a system (10) comprising a plurality of synchronous integrated circuit chips (12, 14, 16), the method comprising:
   detecting a change in processing requirements in one of the plurality of synchronous integrated circuit chips;
   notifying the plurality of synchronous integrated circuit chips that a clock frequency change is to occur;
   achieving a quiescent bus state in each of the plurality of synchronous integrated circuit chips;
   notifying the plurality of synchronous integrated circuit chips that the clock frequency change may occur;
   changing the clock frequency of the plurality of integrated circuit chips wherein the plurality of synchronous integrated circuit chips (12, 14, 16) comprises a plurality of processors (12, 14) and a companion chip (16), and wherein:
   the companion chip (16) receives a control transaction requesting the clock frequency change from the processor (12, 14) in which the change in processing requirements was detected; and
   the companion chip (16) broadcasts the control transaction to the plurality of processors (12, 14); and
   having a companion chip perform (16) a frequency change operation after the frequency change operation has been completed by the plurality of processors (12, 14).

2. The method of claim 1, wherein the clock frequency comprises at least one of a processor clock frequency and a bus clock frequency.

3. The method of claim 1, wherein changing the clock frequency of the plurality of integrated circuit chips comprises, for each integrated circuit chip comprises:
   stopping a bus clock of the integrated circuit chip;
   changing the clock frequency of the integrated circuit chip; and
   restarting the bus clock of the integrated circuit chip.

4. The method of claim 3, wherein changing the clock frequency of the integrated circuit chip results in a change in a clock frequency of the bus clock, and wherein a ratio of the clock frequency of the integrated circuit chip to the clock frequency of the bus clock remains constant.

5. The method of claim 1, wherein changing the clock frequency of the integrated circuit chip comprises:
   determining a new clock frequency;
   selecting a divider value for adjusting an existing clock frequency; and
   applying the divider value to the existing clock frequency to obtain the new clock frequency.

6. The method of claim 1, wherein notifying the plurality of synchronous integrated circuit chips that the clock frequency change may occur takes place only after all of the plurality of synchronous integrated circuit chips have achieved a quiescent bus state.

7. The method of claim 1, wherein the companion chip (16) broadcasts the control transaction over a bus (18) that interconnects the companion chip (16) and the plurality of processors (12, 14), and wherein the plurality of processors (12, 14) obtain the control transaction by snooping the bus (18).

8. The method of claim 1, wherein, after being notified that a clock frequency change is to occur, each of the plurality of processors (12, 14) achieves a quiescent bus state and sends an acknowledgement to the companion chip (16).

9. The method of claim 8, wherein, after receiving the acknowledgement from all of the plurality of processors (12, 14), the companion chip (16) notifies the plurality of processors (12, 14) that the clock frequency change may occur.

10. The method of claim 9, wherein the plurality of processors (12, 14) performs a frequency change operation.

11. The method of claim 8, wherein, after receiving the acknowledgement from all of the plurality of processors (12, 14), the companion chip (16) achieves a quiescent bus state, turns off its bus clock, and notifies the plurality of processors (12, 14) that the clock frequency change may occur.

12. An apparatus for changing a clock frequency, comprising:
   a phase-lock-loop circuit (20) for providing a constant frequency signal in synchronism with a reference clock signal, wherein the constant frequency signal has a frequency f;
   a plurality of divider circuits (28) receiving the constant frequency output signal from the phase-lock-loop circuit (20), each divider circuit providing an output signal having a frequency given by $f/d_n$ and synchronous with the constant frequency signal of the phase-lock-loop circuit (20), wherein $d_n$ is a divider value of an nth divider circuit (28);
   a multiplexer (30) for receiving the output signals from the plurality of divider circuits (28) and for selecting based on a frequency selection signal, the output signal from one of the plurality of divider circuits (28) having a desired frequency to serve as a processor clock signal (pclk), and
   a circuit for performing a frequency change after completing the frequency change by other processors (12, 14).

13. The apparatus of claim 12, wherein the processor clock frequency is changed by selecting the output signal of a different one of the plurality of divider circuits (28) to serve as the processor clock signal (pclk).

14. The apparatus of claim 12, further comprising a bus divider circuit (32) for receiving the processor clock signal and for outputting a bus clock signal (bclk) in synchronism with the processor clock signal (pclk), wherein bclk is given by pclk/b, and wherein b is a divider value of the bus divider circuit (32).

15. The apparatus of claim 14, wherein a ratio of the frequency of the processor clock signal (pclk) to the frequency of the bus clock signal (bclk) remains constant.

16. The apparatus of claim 12, wherein the phase-lock-loop circuit (20) comprises a PLL (22) and a feedback divider (24), and wherein the reference clock and an output of the feedback divider (24) are input into the PLL (22).

17. A method for changing processor and bus clock frequencies in a system (10) comprising a plurality of synchronous processors (12, 14), comprising:
   detecting a change in processing requirements in one of the plurality of processors;

notifying the plurality of processors that processor and bus clock frequency changes are to occur;
achieving a quiescent bus state in each of the plurality of processors;
notifying the plurality of processors that the processor and bus clock frequency changes may occur; and
changing the processor and bus clock frequencies of each of the plurality of processors and having another chip perform a frequency change operation after the frequency change operation has been completed by the plurality of processors.

18. The method of claim 17, wherein a ratio of the processor clock frequency and the bus clock frequency of each processor remains constant.

* * * * *